(12) United States Patent
Ha et al.

(10) Patent No.: US 6,204,520 B1
(45) Date of Patent: Mar. 20, 2001

(54) THIN FILM TRANSISTOR, LIQUID CRYSTAL DISPLAY AND FABRICATING METHODS THEREOF

(75) Inventors: Yong-Min Ha; Joo-Cheon Yeo, both of Kyongki-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/123,831

(22) Filed: Jul. 28, 1998

(30) Foreign Application Priority Data

Jul. 29, 1997 (KR) .................................................. 97-35754
Jan. 20, 1998 (KR) .................................................... 98-1472

(51) Int. Cl.[7] .................................................. H01L 29/12
(52) U.S. Cl. .............................................. 257/72; 257/66
(58) Field of Search ........................................ 257/72, 66

(56) References Cited

U.S. PATENT DOCUMENTS

| 4,888,631 | * | 12/1989 | Azuma | 257/66 |
| 4,918,504 | * | 4/1990 | Kato | 257/72 |
| 5,773,844 | * | 6/1998 | Kawamura | 257/72 |
| 5,939,731 | * | 8/1999 | Yamazaki | 257/72 |
| 5,940,151 | * | 8/1999 | Ha | 257/72 |

* cited by examiner

Primary Examiner—Mahshid Saadat
Assistant Examiner—Bradley W. Baumeister
(74) Attorney, Agent, or Firm—Long, Aldridge & Norman

(57) ABSTRACT

The present invention relates to a thin film transistor (TFT), liquid crystal display (LCD) and fabricating methods thereof, and more particularly to a TFT having source/drain lines on which an insulating layer and an active layer are located lie on an insulated substrate, to an LCD using the TFT and fabricating methods of the TFT and LCD. The TFT has a BBC (Buried Bus Coplanar) structure by forming a source/drain line on a substrate and by forming a buffer layer which covers the source/drain line which simplifies the process by means of reducing the number of deposition steps. The BBC structure of TFT has a source/drain line on a substrate, an insulating layer covering the source/drain line and the entire disclosed surface and a coplanar structure on the insulating layer. The present invention also provides a data line in the TFT of the BBC structure having low resistance applicable to a wide-screen by means of forming both the buffer layer and the source/drain line with a sufficient thickness.

22 Claims, 13 Drawing Sheets

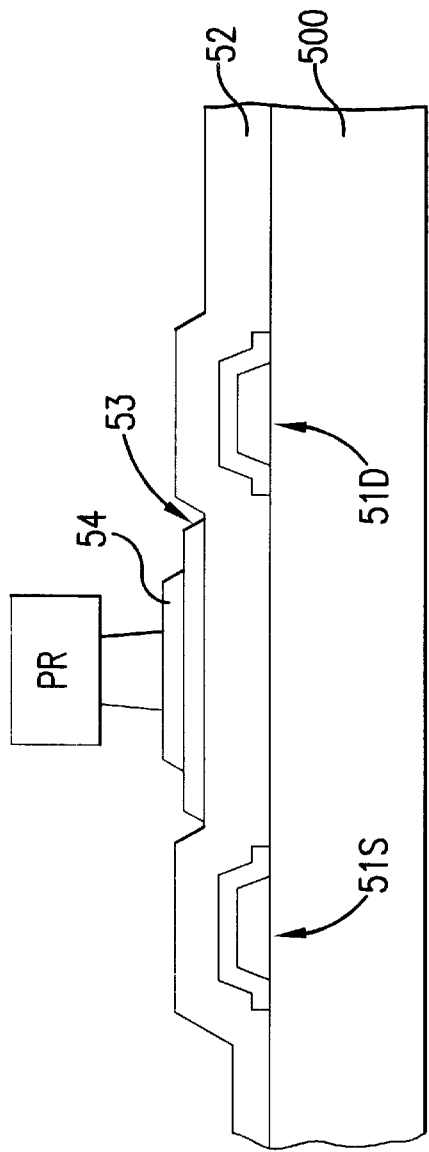
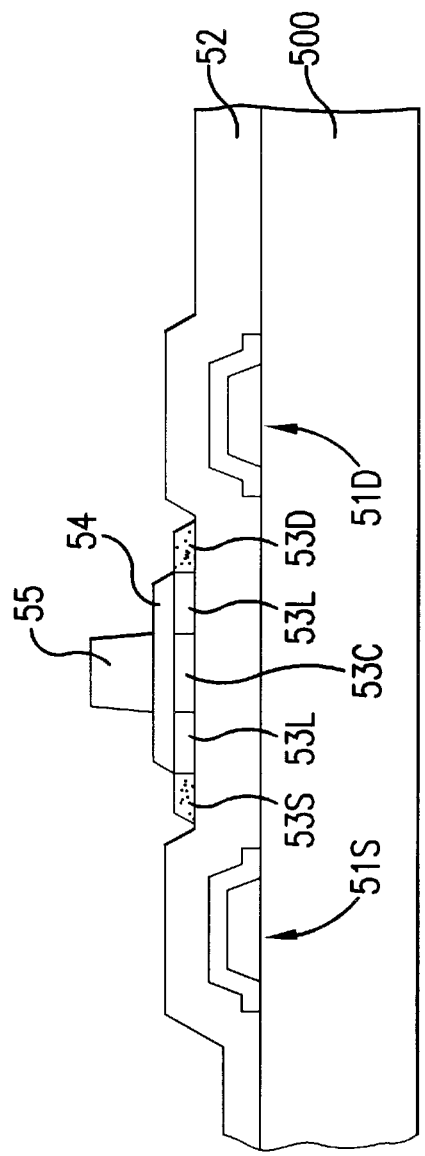
FIG.5B
FIG.5C

THIN FILM TRANSISTOR, LIQUID CRYSTAL DISPLAY AND FABRICATING METHODS THEREOF

BACKGROUND OF THE INVENTION

This application claims the benefit of Korean Application Nos. 97-35754, filed on Jul. 29, 1997 and 98-1472, filed Jan. 20, 1998, which are hereby incorporated by reference.

1. Field of Invention

The present invention relates to a thin film transistor (TFT), liquid crystal display (LCD) and fabricating methods thereof, and more particularly a TFT having source/drain lines on which an insulating layer and an active layer are located and lie on an insulated substrate.

2. Discussion of Related Art

FIGS. 1A to 1E show cross-sectional views of a method of fabricating a TFT having coplanar structure and LCD having a storage capacitor according to first prior art.

Referring to FIG. 1A, a buffer layer 11 is deposited on a glass substrate 100 of an insulated substrate. In this case, the buffer layer 11 prevents impurities of the glass substrate 100 from penetrating into a silicon layer during the crystallization of amorphous silicon by both depositing and annealing amorphous silicon. Then, an active layer 12 is formed by etching a crystallized amorphous silicon layer, which is crystallized by laser annealing after the amorphous silicon layer has been deposited on the first insulating layer 11 through photolithography. To form a first storage electrode 12T of a storage capacitor, a selective impurity doping process is carried out by using a photoresist pattern PR on the active layer 12.

Referring to FIG. 1B, a second insulating layer and a conductive layer are formed in turn on the disclosed surface. A second storage electrode 14T corresponding to the gate electrode 14G and a gate line(not shown in the drawing) is formed by etching the conductive layer. A gate insulating layer 13 is formed by etching the second insulating layer by using the second storage electrode 14T as a mask.

Referring to FIG. 1C, a source region 12S and a drain region 12D are formed in the active layer 12 by doping the entire disclosed surface with impurity. In this case, the gate electrode 14G defines a channel region 12C which is under the gate electrode 14G and in the active layer 12 by blocking impurity, wherein the drain region 12D is connected to the first storage electrode 12T.

Referring to FIG. 1D, a third insulating layer 15 is formed on the entire disclosed surface. A first contact hole disclosing the source and drain region 12S and 12D of the active layer 12 is formed by etching the third insulating layer 15 through photolithography. After another conductive layer has been deposited on the entire disclosed surface, a source electrode 16S connected to the source region 12S, a data line(not shown in the drawing) and a drain electrode 16D are formed by etching the conductive layer through photolithography.

Referring to FIG. 1E, a fourth insulating layer is deposited on the entire disclosed surface. A second contact hole disclosing the drain electrode 16D is formed by etching the fourth insulating layer 17 through photolithography. Then, a transparent conductive layer is deposited on the entire disclosed surface. A pixel electrode 18 connected to the drain electrode 16D is formed by etching the transparent conductive layer through photolithography.

As explained above, the first prior art requires a step of depositing an insulating layer for forming a buffer layer in order to prevent impurities of a glass substrate from penetrating into a silicon layer during the crystallization of amorphous silicon by depositing and annealing amorphous silicon. The step of depositing the insulating layer is complicated and increases the manufacturing cost. Moreover, the above step also requires two photolithography processes to form two contact holes. The photolithography process is carried out by a series of complicated and fine steps, such as masking, applying photoresist, performing exposure and development, which affects productivity and integrity of the product. A major factor in the LCD production is the simplification of fabricating process by means of reducing the number of such photo-etch and the steps of forming insulating layers.

FIG. 2 shows a cross-sectional view of TFT having a staggered structure according to second prior art.

A source electrode 21S and a drain electrode 21D are formed on an insulated substrate 200 and then an active layer 23 is formed connected to the electrodes 21S and 21D. The active layer may be formed by the following steps of depositing an amorphous silicon layer on an entire disclosed surface, crystallizing the amorphous silicon layer by laser annealing and etching the crystallized silicon layer. A source region 23S and a drain region 23D are formed in the active layer 23 by an impurity-doping process after a gate insulating layer 24 and a gate electrode 25 have been formed in turn on a certain part of the active layer 23. An insulating layer 26 then covers the entire disclosed surface. A contact hole disclosing the drain region 23D is formed in the insulating layer 26. A pixel electrode 27 connected to the drain region 23D is formed on the insulating layer 26.

In the above-mentioned second prior art, an amorphous silicon layer is crystallized by annealing after the amorphous silicon layer covering the electrodes of source 21S and drain 21D have been deposited. Accordingly, the step or height difference increases when the thickness of the source and the drain electrodes are increased in order to reduce resistance of a conductive line. So a silicon layer on the part of the step might become open or exposed when the amorphous silicon is abnormally deposited on the electrodes or laser-annealed. Moreover, the crystal characteristics of a part where silicon contacts with a metal electrode are inferior to that of the other part where silicon is intact. Hence, the current characteristic of TFT is rendered inferior.

SUMMARY OF THE INVENTION

Accordingly, the present invention is directed to a TFT, LCD and fabricating methods that substantially obviate one or more of the problems due to limitations and disadvantages of the prior art.

The object of the present invention is to provide a TFT having a structure of BBC(Buried Bus Coplanar) by forming a source/drain line on a substrate and by forming a buffer layer which covers the source/drain line and is required for the crystallization of silicon, simplifying the process by means of reducing the deposition steps which are fewer than in prior art. The BBC structure of the TFT has a source/drain line on a substrate, an insulating layer covering the source/drain line and the entire disclosed surface and a coplanar structure on the insulating layer.

Another object of the present invention is to provide a data line in the TFT of the BBC structure having low resistance applicable to a wide-screen by means of increasing the thickness of both the buffer layer and the source/drain line.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor of the invention includes a substrate, a source and a drain electrode on the substrate, a buffer layer covering the source and the drain electrodes and a disclosed surface, an active layer on the buffer layer wherein the active layer has a source region, a channel region and a drain region, a gate insulating layer on the active layer, and a gate electrode on the gate insulating layer.

In another aspect of the present invention, a liquid crystal display includes an insulated substrate, a data line on the insulated substrate, a buffer layer covering the data line, an active layer on the buffer layer, wherein the active layer has source, channel and drain regions, a insulating layer covering the active layer, a gate electrode overlapped with the channel region, a gate line connected to the gate electrode, wherein the gate line crosses with the data line, a passivation layer covering the gate electrode and the gate line, a first contact hole in the first, the second or the passivation layer, wherein the first contact hole discloses a portion of the data line, a second contact hole disclosing the source region, a third contact hole disclosing the drain region, a connecting wire connecting the data line to the source region through the first and second contact hole, and a pixel electrode connected to the drain region through the third contact hole.

In another aspect of the present invention, a method of fabricating thin film transistor includes the steps of forming source and drain electrodes on a substrate, forming an insulating layer covering the source and the drain electrodes and a disclosed surface, forming an active layer on the insulating layer, forming a gate insulating layer and a gate electrode on a certain part of the active layer, and forming source and drain regions in the active layer by means of doping the active layer selectively with impurity.

In a further aspect of the present invention, a method of fabricating liquid crystal display includes the steps of forming a data line on an insulated substrate, forming a buffer layer covering the data line, forming an active layer on the buffer layer, forming a insulating layer covering the active layer, forming a gate line in said active layer, wherein the gate line is connected to the gate electrode and the gate electrode and crosses with the data line, forming a source region, a channel region and a drain region in the active layer by doping the active layer with impurity by using the gate electrode as a mask, forming a passivation layer covering the active layer, the gate electrode and the gate line, forming a first contact hole disclosing a portion of the data line, forming a second contact hole disclosing the source region, forming a third contact hole disclosing the drain region, forming a connecting wire connecting a disclosed portion of the data line to the disclosed source region through the first and the second contact hole, and forming a pixel electrode connected to the drain region through the third contact hole.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIGS. 5A to 5D show cross-sectional views of TFT fabrication process according to a third preferred embodiment of the present invention;

DETAILED DESCRIPTION OF THE PREFERRED EMBODIMENTS

Reference will now be made in detail to preferred embodiments of the present invention, examples of which are illustrated in the accompanying drawings.

FIGS. 3A to 3E show cross-sectional views of TFT fabrication process according to a first preferred embodiment of the present invention.

Figure 1A:
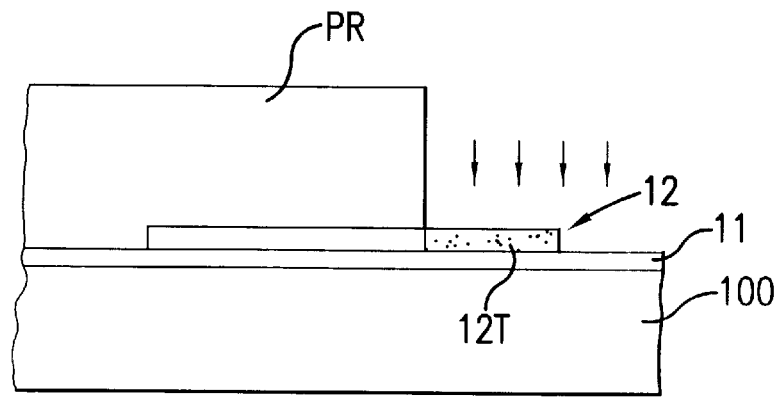
FIGS. 1A to 1E show cross-sectional views of LCD fabrication processes according to first prior art.
Figure 1B:
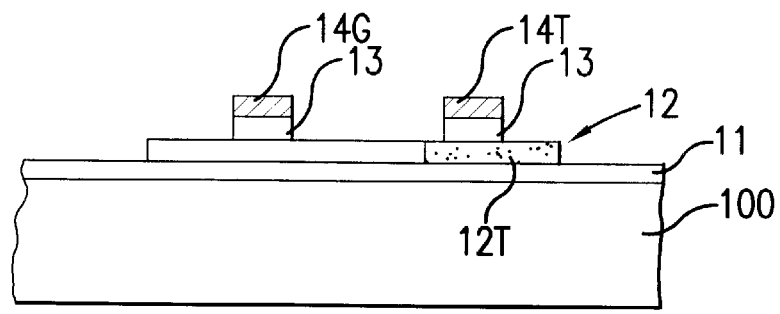
Figure 1C:
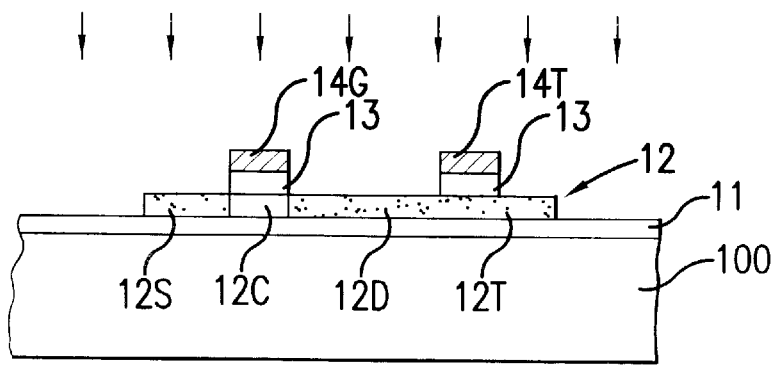
Figure 1D:
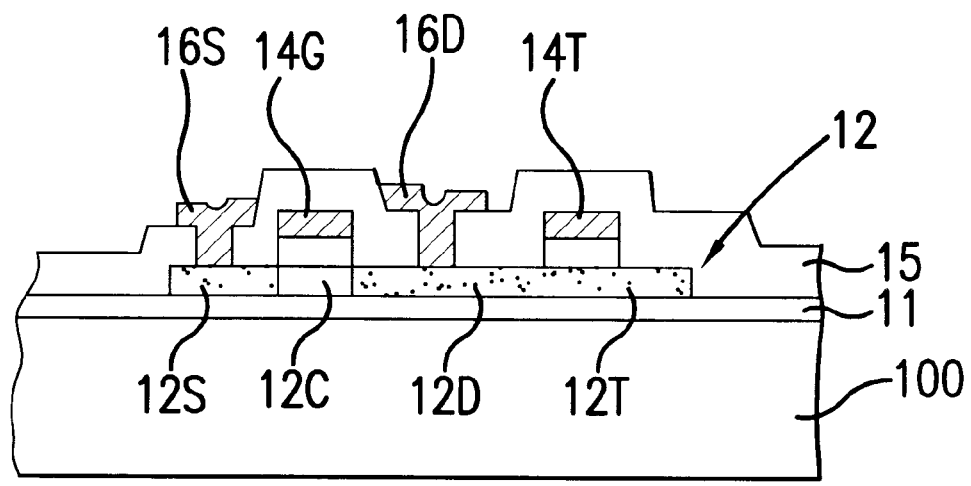
Figure 1E:
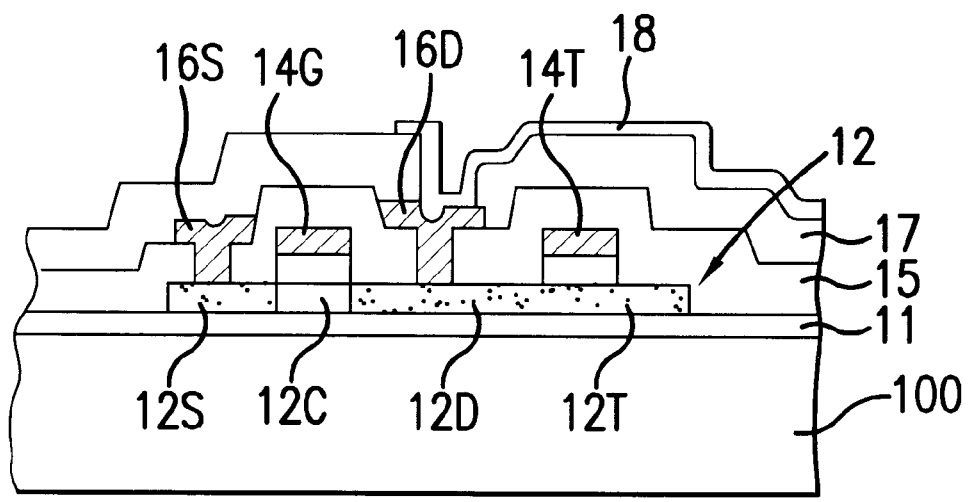
Figure 2:
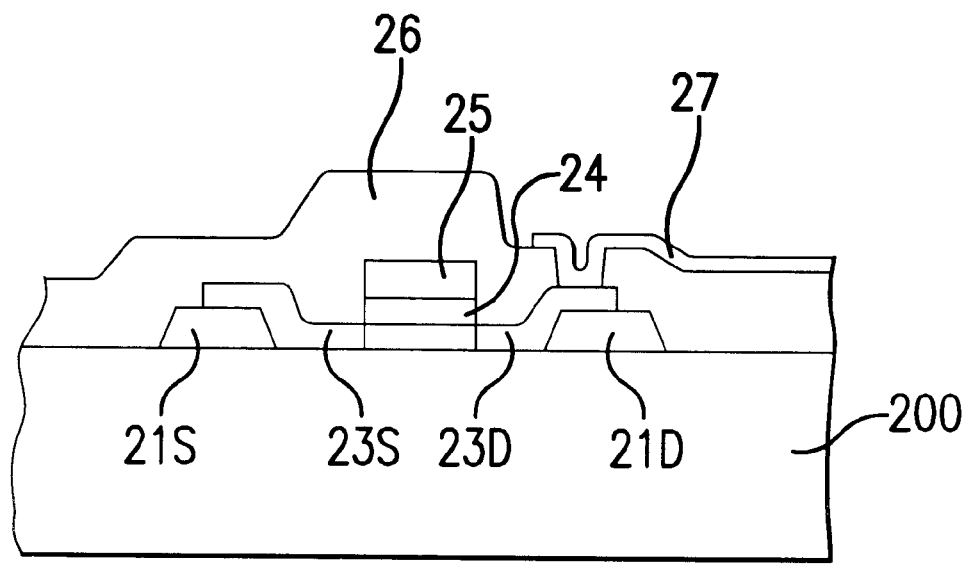
FIG. 2 shows a cross-sectional view of TFT according to second prior art.
Figure 3A:
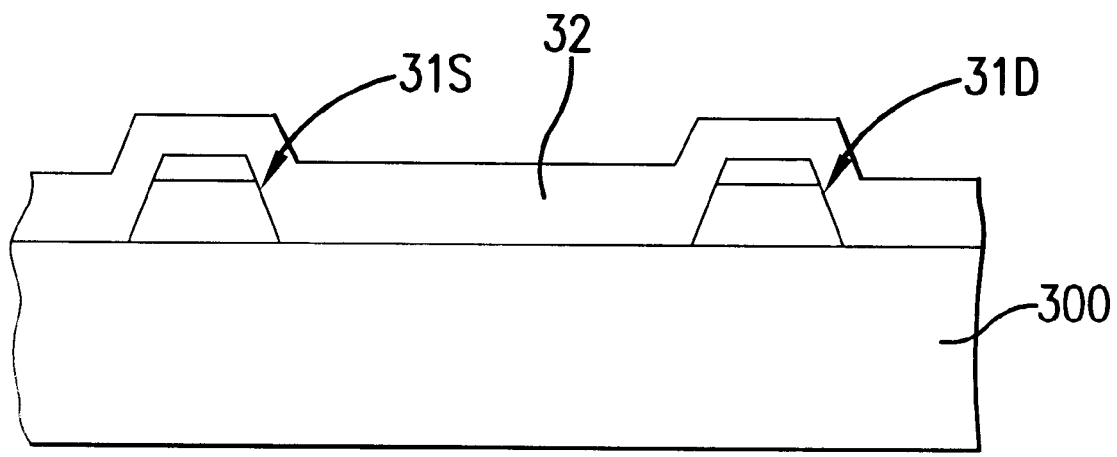
FIGS. 3A to 3E show cross-sectional views of TFT fabrication process according to a first preferred embodiment of the present invention.

Referring to FIG. 3A, source and drain electrodes 31S and 31D are formed on a glass substrate 300 made of an insulated substrate. The source/drain line of double-layers may be formed to have low resistance. An Al layer and an Mo layer are simultaneously etched after the Al layer and the Mo layer have been formed in turn on a disclosed surface of the substrate 300. Alternatively, an Al layer having been deposited on a disclosed surface of the substrate are first etched. Successively, an Mo layer is deposited on the entire surface and then etched. Subsequently, a source/drain line of double-layers are formed. Alternatively, the source/drain line may have at least a single layer and be formed with any suitable conductive material other than the Al and Mo layers.

Next, a buffer layer 32 covering the source and drain electrode 31S and 31D is deposited. The buffer layer 32 is necessary for the TFT of BBC structure in order to electrically isolate the source and drain electrodes 31S and 31D, respectively, which have been formed directly on the substrate 300, from other components formed on the source and drain electrodes 31S and 31D.

Figure 3B:
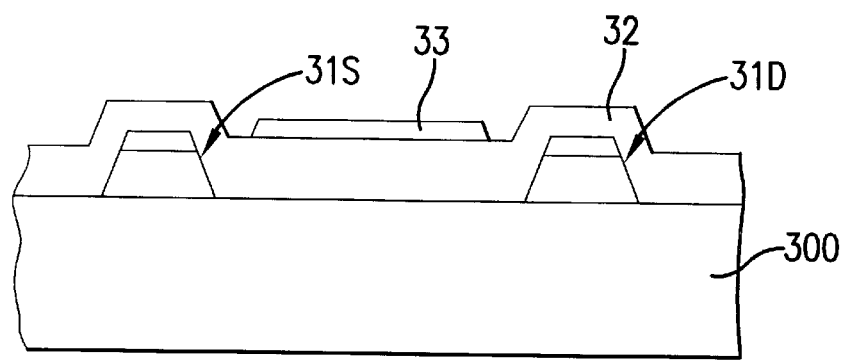

Referring to FIG. 3B, to form an active layer 33 an amorphous silicon layer is crystallized to form a polycrystalline silicon layer by laser annealing after the amorphous silicon layer has been formed on the disclosed buffer layer 32. In that regard, the buffer layer 32 prevents impurities of the glass substrate 300 from penetrating into the silicon layer. The buffer layer 32 also functions as a buffer layer to thermally isolate the silicon layer from the substrate during the crystallization of an amorphous silicon layer. Hence, the buffer layer 32 may be required to be formed to the thickness greater than about 1000 Å and preferably about 3000 to 5000

Å. Then, the active layer 33 is formed by etching the crystallized silicon layer through photolithography. The buffer layer 32 is formed by depositing an organic insulating material, such as, organic insulating material or inorganic insulating material including silicon oxide, silicon nitride or the like, preferably with a conventional method of PECVD (Plasma Enhanced Chemical Vapor Deposition).

Figure 3C:
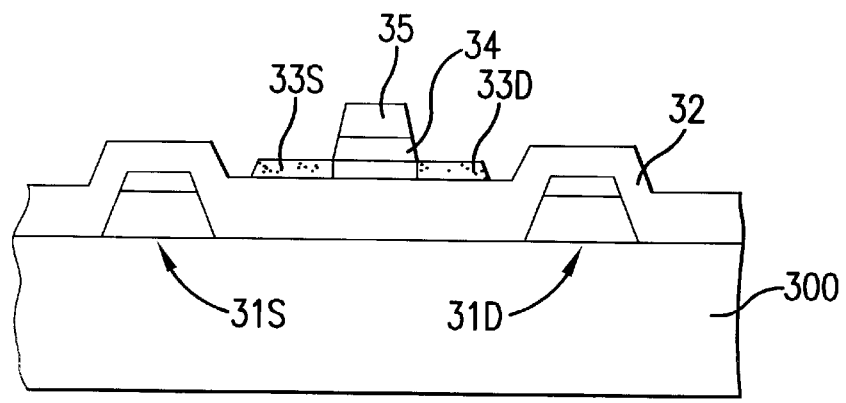

Referring to FIG. 3C, a insulating layer and a metal conductive layer are formed in turn on the entire disclosed surface of the substrate. The thickness of the insulating layer is approximately 1300 to 1500 Å. A gate electrode 35 is formed by etching the metal conductive layer through photolithography, and then, a gate insulating layer 34 is formed by leaving the insulating layer under the gate electrode 35. Source and drain regions 33S and 33D, respectively, are formed in the active layer 33 not blocked by the gate electrode 35 by doping the entire surface of the substrate with impurity.

The doping of the active layer 33 may be accomplished preferably using an ion implantation process either after or before etching the insulating layer formed on top of the active layer. For example, if the insulating layer is not etched and the p-type impurity is being doped into the active layer 33, then the ion implantation energy of about 40 to 70 KeV is required. If the insulating layer is not etched and the n-type impurity is being doped into the active layer 33, then the ion implantation energy of about 80 to 100 KeV is required. If the insulating layer is etched and the p or n-type impurity is being doped into the active layer 33, then the ion implantation energy of about 10 KeV is required. Alternatively, the insulating layer can be partially etched before doping the active layer 33. Depending on the thickness of the insulating layer, the ion implantation energy for doping the active layer can be varied respectively.

Figure 3D:
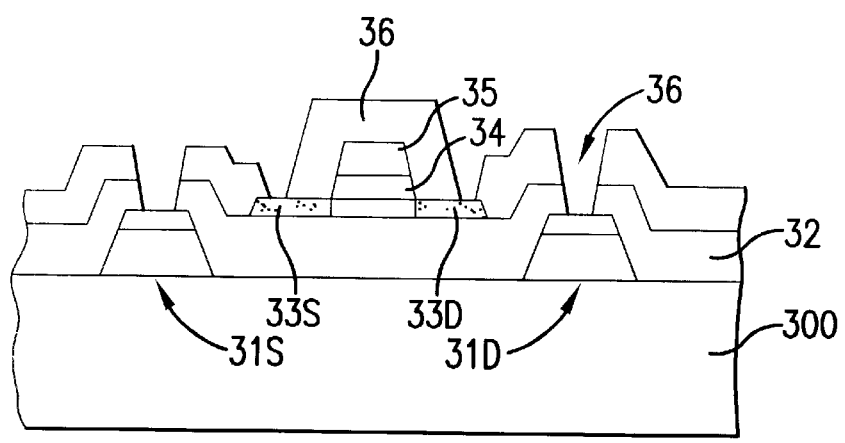

Referring to FIG. 3D, a passivation layer 36 is deposited on the disclosed surface. Contact holes disclosing the source electrode 31S, the source region 33S, the drain electrode 31D and the drain region 33D are formed by etching the passivation layer 36 and the buffer layer 32.

Figure 3E:
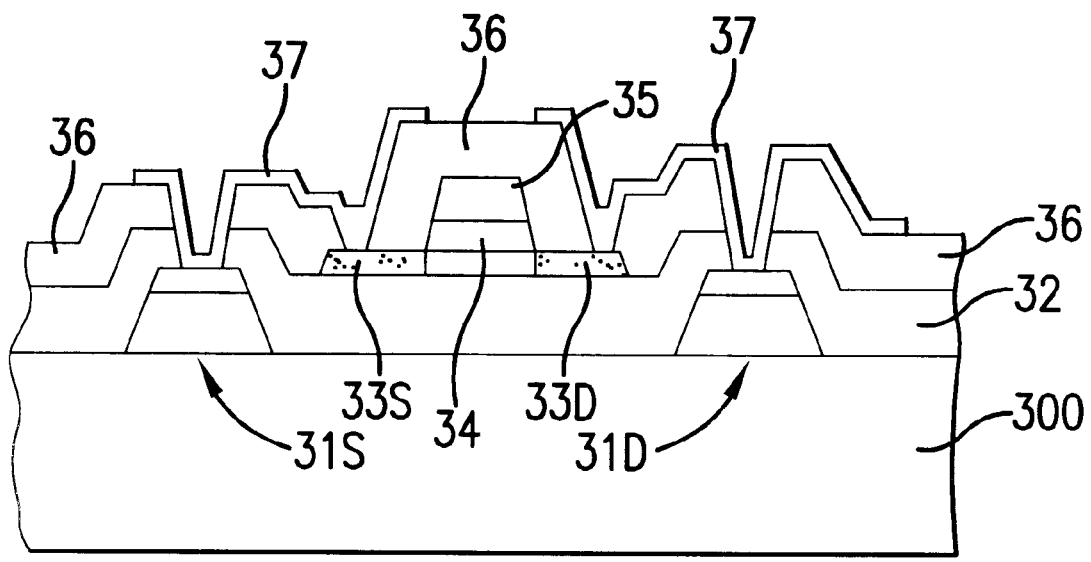

Referring to FIG. 3E, a transparent conductive layer covering the disclosed surface is deposited. A first connecting wire 37 connecting the source electrode 31S to the source region 33S and a second connecting wire 38 connecting the drain electrode 31D to the drain region 33D are formed by etching the transparent conductive layer through photolithography. In this case, the first and second connecting wire 37 and 38 may be used as a connecting wire which electrically connects two thin film transistors. The second connecting wire 38 may be applied to a pixel electrode connected to the drain electrode in the liquid crystal display. Alternatively, the first and second connecting wires 37 and 38 may be formed by depositing a conductive material different from the transparent conductive material. The transparent conductive layer is preferably formed by depositing a transparent conductive material, such as Indium Tin Oxide or the like, using a conventional method of deposition, such as sputtering.

As explained above, the thin film transistor according to the present invention uses polycrystalline silicon having excellent reliability and provides a simplified process by reducing a step of depositing an insulating layer, wherein the source and drain electrodes having a BBC structure are formed on a substrate and a buffer layer for the crystallization of silicon covers the source and drain electrodes. Comparing to the method for a conventional coplanar structure, the fabricating process of the present invention is simplified by forming a contact hole by a single photo-etch. Moreover, the present invention is also applied to a device requiring a low resistance wire since the buffer layer is deposited with a sufficient thickness to form the thick source and drain electrodes.

Figure 4:
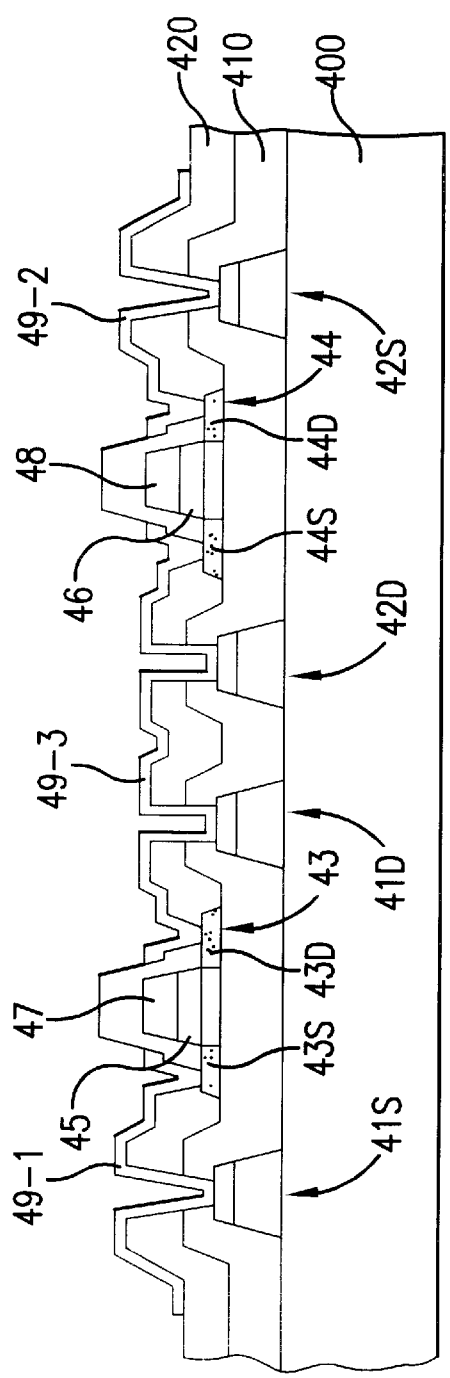
FIG. 4 show a cross-sectional view of TFT according to a second preferred embodiment of the present invention.

FIG. 4 shows a cross-sectional view of the CMOS thin film transistors according to the second preferred embodiment of the present invention.

An n-typed TFT and a p-typed TFT on an insulated substrate 400 are connected by first, second and third connecting wires 49-1, 49-2 and 49-3, respectively, forming a CMOS transistor. The n-typed TFT and the p-typed TFT have the same structures but have the different types of impurities diffused in the source regions 43S and 44S and the drain regions 43D and 44D.

The fabricating method of the CMOS TFT is similar to that of the first preferred embodiment and is as follows.

The source and drain electrodes 41S and 42S are formed on a substrate 400. A buffer layer 410 covering the surfaces of the source and drain electrodes 41S, 42S, 41D and 42D are formed. Active layers 43 and 44 are formed on the buffer layer 410, on which gate insulating layers 45 and 46 and gate electrode 47 and 48 are formed in turn.

A source region 43S and a drain region 43D are formed by means of selectively doping the active layer 43 of an n-typed TFT with n-typed impurity. The other source region 44S and the drain region 44D are formed by means of selectively doping the active layer 44 of an p-typed TFT with p-typed impurity. A passivation layer 420 covering the whole surface is then formed.

Contact holes disclosing the source electrodes 41S and 42S, the drain electrodes 41D and 42D, source regions 43S and 44S and the drain regions 43D and 44D are formed, respectively. The n-typed TFT and the p-typed TFT are connected electrically to form a CMOS TFT by a first transparent connecting wire 49-1 connecting the source electrode 41S to the source region 43S of the n-typed TFT, a second connecting wire 49-2 connecting the source electrode 42S to the source region 44S of the p-typed TFT and a third transparent connecting wire 49-3 connecting all of the drain electrodes 41D and 42D and the drain regions 43D and 44D of n-typed and p-typed TFT. The connecting wires 49-1 to 49-3 may be also formed with a suitable metal conductive material instead of the transparent conductive material.

As explained above, the CMOS TFT can be used for the semiconductor circuit device or LCD. The circuit may be formed by arranging either n-typed TFTs or p-typed TFTs, instead of forming the circuit with CMOS TFTs.

FIGS. 5A to 5D show cross-sectional views of fabricating TFT according to a third preferred embodiment of the present invention wherein the TFT is preferably a polycrystalline silicon TFT having both the BBC and the LDD (Lightly Doped Drain) structures.

Figure 5A:
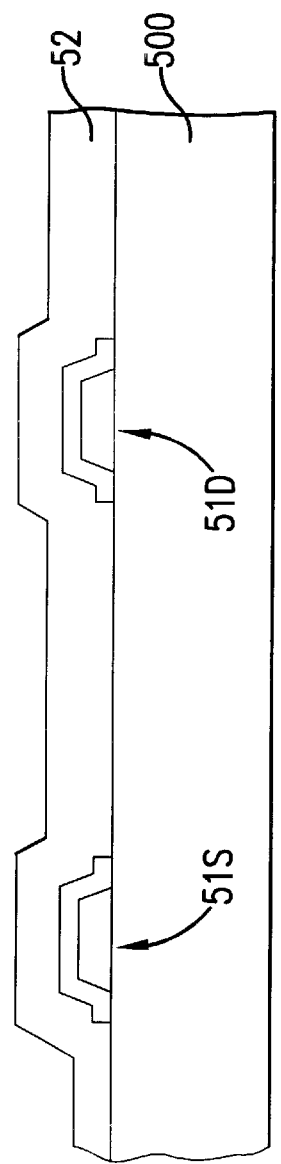

Referring to FIG. 5A, a source electrode 51S and a drain electrode 51D are formed on a glass substrate 500 of an insulated substrate. A double-layered source and drain line may be formed in order to provide low resistance. An Al layer and an Mo layer are etched simultaneously after the Al layer and the Mo layer have been formed in turn on a disclosed surface of the substrate 500. Alternatively, if an Al layer is initially deposited on the substrate, the Al layer is etched. Successively, a Mo layer is deposited on the whole surface and then etched. Subsequently, a source/drain line of double-layers are formed. The source/drain line may have at least a single layer and be formed with a suitable conductive material other than the Al and Mo layers.

Next, a buffer layer 52 is formed to cover the source and drain electrodes 51S and 51D and the disclosed surface of the substrate 500. The buffer layer 52 is required for electrically isolating the source and the drain electrode 51S and 51D formed directly on the substrate and other components to be formed on or near the vicinity of the electrode 51S and 51D.

The buffer layer 52 is formed by depositing an organic insulating material, such as, organic insulating material or inorganic insulating material including silicon oxide, silicon nitride or the like, preferably with a conventional method of PECVD (Plasma Enhanced Chemical Vapor Deposition).

Referring to FIG. 5B, an amorphous silicon layer is crystallized by laser annealing after the amorphous silicon layer has been formed on the disclosed buffer layer 52. The buffer layer 52 prevents impurities of the glass substrate 500 from penetrating into the silicon layer and functions as a buffer layer to thermally isolate the silicon layer from the substrate during the crystallization of an amorphous silicon layer. Accordingly, the buffer layer 52 may be required to be formed to the preferred thickness of greater than about 1000 Å.

An active layer 53 is formed on the buffer layer 52 by etching the crystallized silicon layer. A second layer covering the disclosed surface and a conductive layer is deposited in turn. A photoresist pattern PR is defined on the conductive layer. A gate electrode 55 located under and within the photoresist pattern PR is formed by over-etching by using the photoresist pattern PR as a mask. A gate insulating layer 54 protruding out of the gate electrode 54 is formed by anisotropic etch by using the photoresist pattern PR as a mask.

Referring to FIG. 5C. the source and drain regions 33S and 33D are formed within the active layer 53 not blocked by the gate insulating layer 54 by doping the surface of the substrate with impurity. In this case, LDD regions 53L are formed between the source region 53S and a channel region 53C and between the drain region 53D and the channel region 53C during the impurity doping step with high energy and high density. Off-set regions are formed between the source region 53S and the channel region 53C and between the drain region 53D and the channel region 53C during the other impurity doping step with low energy and high density.

Figure 5D:
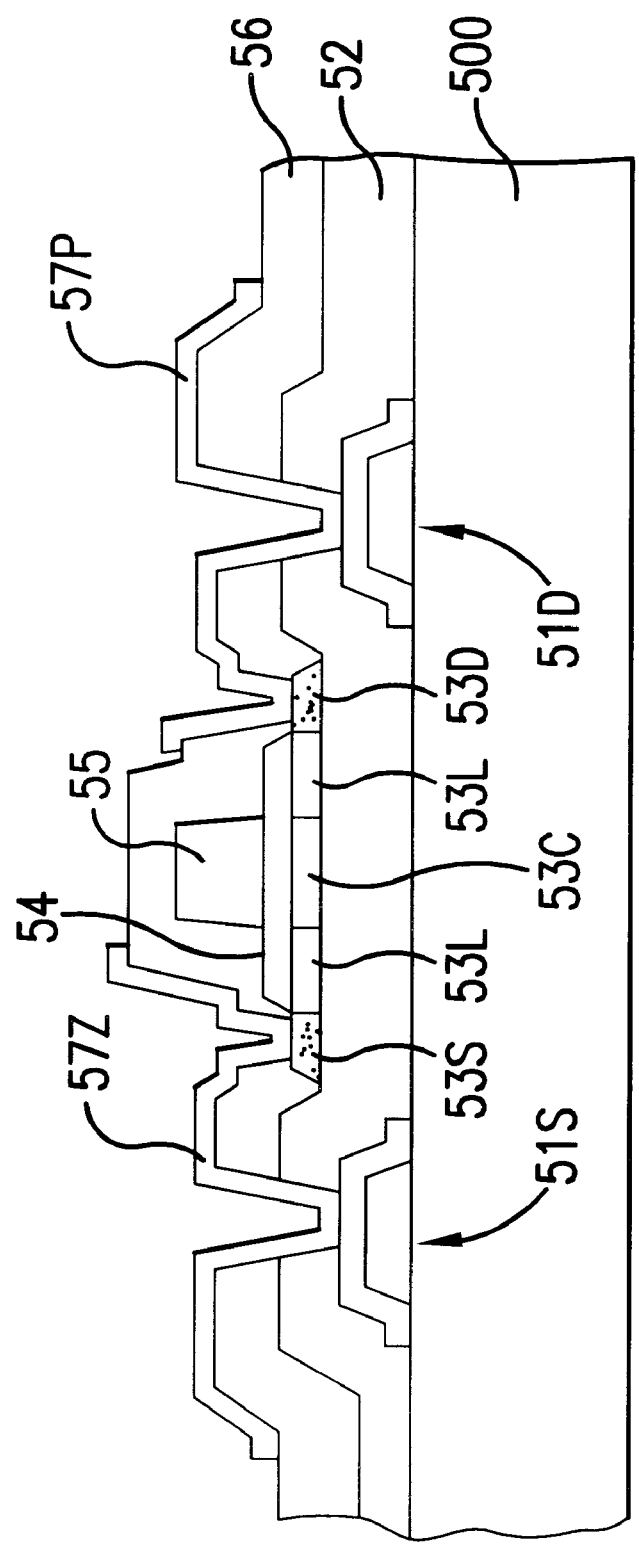

Referring to FIG. 5D, a passivation layer 56 is deposited on the disclosed surface. Contact holes disclosing the source electrode 51S, the source region 53S, the drain electrode 51D and the drain region 53D are formed by etching the passivation layer 56 and the buffer layer 52.

A transparent conductive layer covering the disclosed surface is deposited. A first connecting wire 57 connecting the source electrode 51S to the source region 53S and a second connecting wire 58 connecting the drain electrode 51D to the drain region 53D are formed by etching the transparent conductive layer through photolithography. In this case, the first and the second connecting wires 57 and 58 may be used for a connecting wire which electrically connects two thin film transistors. The second connecting wire 58 may be applied to a pixel electrode connected to the drain electrode in a liquid crystal display. The first and the second connecting wires 57 and 58 may be formed by depositing any suitable conductive material different from the transparent conductive material. A TFT having both the BBC and the LDD structures may be used with the CMOS TFT structure described above with respect to FIG. 4.

Figure 6:
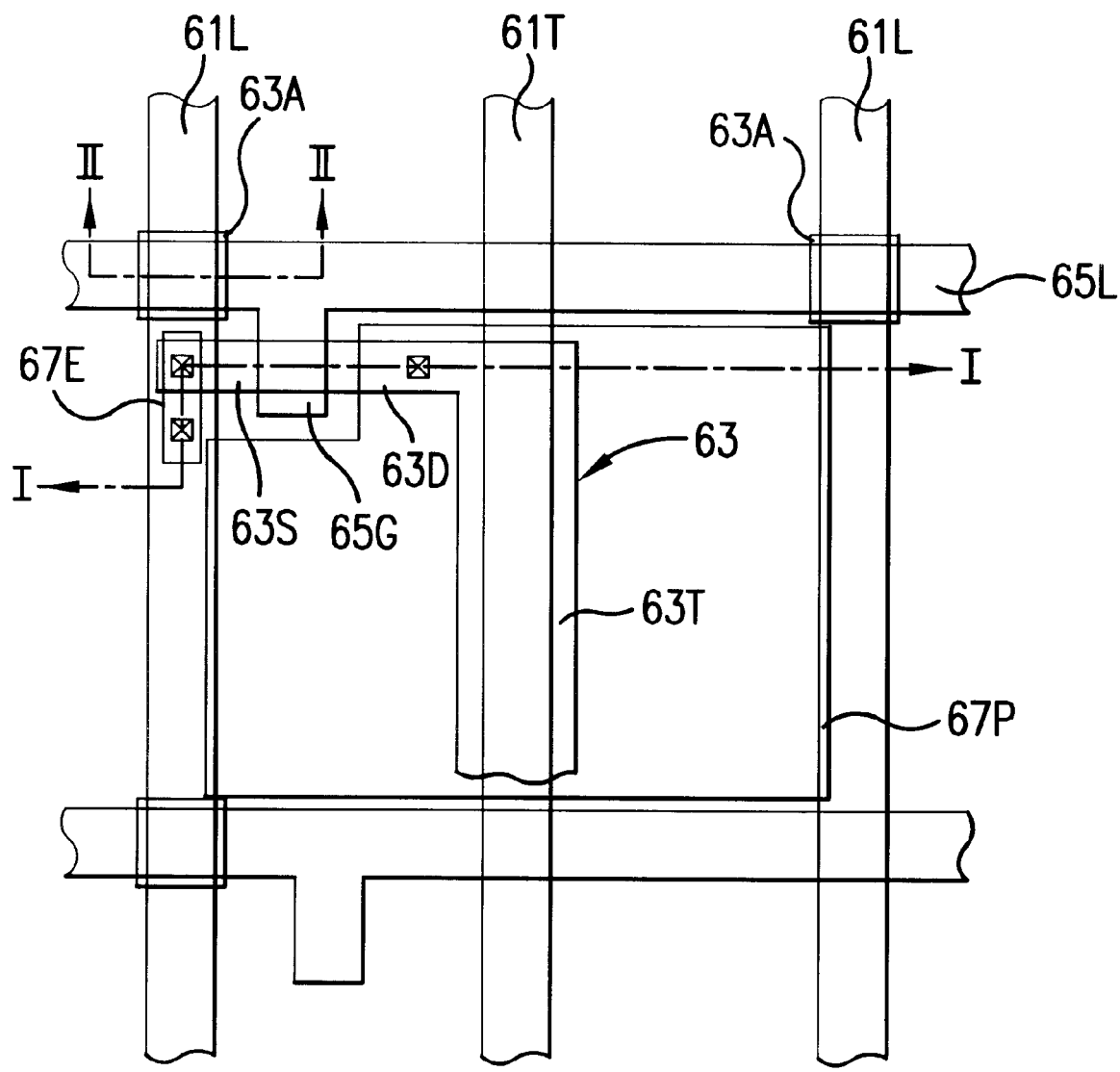
FIG. 6 shows a layout of the LCD according to the first preferred embodiment of the present invention.

FIG. 6 shows a layout of the LCD according to the first preferred embodiment of the present invention. A capacitor is formed and a interlayer is formed at the crossing part between a data line 61L and a gate line 65L.

A pixel is formed at the crossing part between a data line 61L and a gate line 65L extended from a gate electrode 65G. A first storage electrode line 61T is in parallel with the data line 61L. The first storage electrode line 61T is at the same level as the data line 61L and is made of the same material as the data line 61L. A TFT equipped with the gate electrode 65G, a source region 63S and a drain region 63D is connected electrically to the crossing part between the gate line 64L and the data line 61L. A second storage electrode line 63T forming a storage capacitor corresponding to the first storage electrode line 61T is located at the upper part of the first storage electrode line 61T.

The source region 63S in an active layer 63 is connected to the data line 61L by a transparent wire 67E, and the drain region 63D is connected to a pixel electrode 67P overlapped with the data line 61L. Accordingly, a signal applied to the data line 61L is carried to the source region 63S through the transparent wire 67E, reaching the pixel electrode 67P through the drain region 63D. The pixel electrode 67P overlapped with the data line 61L improves aperture ratio of the pixel.

An interlayer 63A made of the same material as the active layer 63 is inserted between the crossing region of the gate line 65L and the data line 61L. The interlayer 63A is formed to prevent an electric shorting generated between the gate line 65L and the data line 61L.

Figure 7:
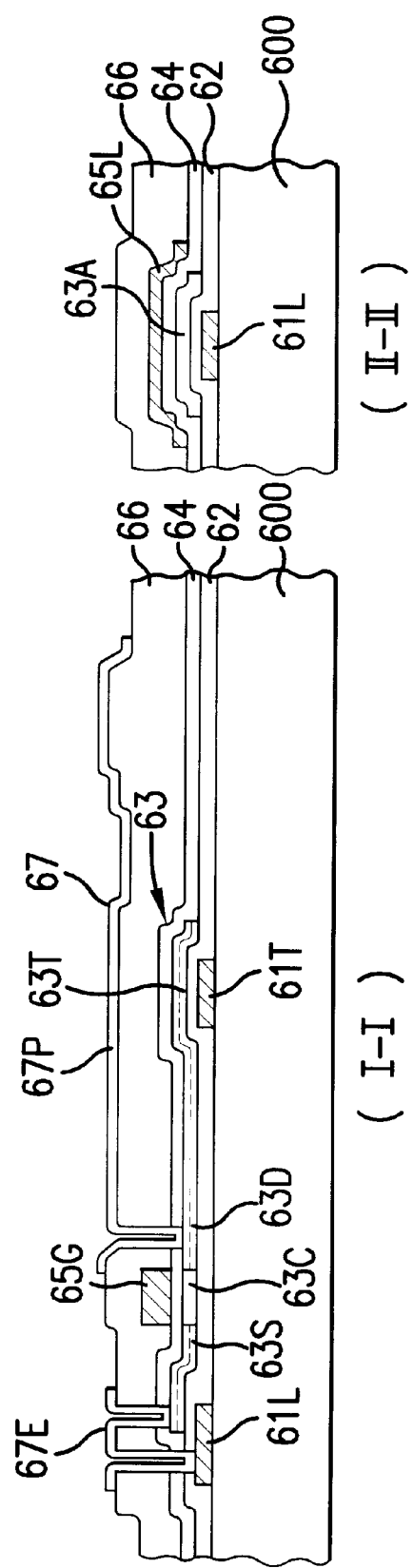
FIG. 7 shows a cross-sectional view of the LCD shown in FIG. 6.

FIG. 7 shows a cross-sectional view of the LCD corresponding to the cutting lines of I—I and II—II shown in FIG. 6.

Referring to a cross-sectional view bisected along with the cutting line I—I, the data line 61L and the first storage electrode line 61T are formed on the glass substrate 600, on which the buffer layer 62 having a contact hole which discloses a portion of the data line 61L lies. The active layer 63 is formed on the buffer layer 62. The source region 63S, the channel region 63C, the drain region 63D and the second storage electrode line 63T extended to the drain region 63D are formed on the buffer layer 62. In this case, the second storage electrode line forms a storage capacitor corresponding to the first storage electrode line 61T. The source region 63S, the drain region 63D and the second storage electrode line 63T have been heavily doped with the n-typed or p-typed impurity.

The insulating layer 64 which covers the surface of the active layer 63, discloses a portion of the disclosed data line 61L and discloses the source and the drain regions 63S and 63D of the active layer 63. The gate electrode 63G is formed on the insulating layer 64 corresponding to the channel region 63C of the active layer 63. On the gate electrode 63G, a passivation layer 66 disclosing directly a portion of the disclosed data line 61L, the source region 63S and the drain region 63D are formed. The passivation layer 66 may be formed with a sufficient thickness by using an organic insulating material.

On the passivation layer 66, the transparent wire 67E connecting the disclosed source region 63S to the disclosed data line 63L and the pixel electrode 67P connected to the disclosed drain region 63D are formed. A portion of the pixel electrode 67P having been formed on the passivation layer 66 of preferably a thick organic insulating material may be overlapped with the data line 61L since the parasitic capacitance generated by the pixel electrode 67P and the data line 61L is relatively small on account of the thick passivation layer 66 having a low dielectric constant.

Referring to a cross-sectional view bisected along with the cutting line II—II of FIG. 6, a interlayer 63A comprising polycrystalline silicon is inserted between where the gate line 66L crosses the data line 61L. The data line 61L is on the glass substrate 600, on which the interlayer 63A of polycrystalline silicon is formed. The second gate insulating layer 64 and the gate line 64L are formed on the interlayer 63A. The third gate insulating layer 66 covers the gate line 64L. Accordingly, a triple layer of the buffer layer 62, the interlayer 63A and the insulating layer 64 is inserted between the data line 61L and the gate line 64L, resulting in less probability of electrical short.

FIGS. 8A to 8D show cross-sectional views of the fabricating process of the LCD shown in FIG. 7.

Figure 8A:
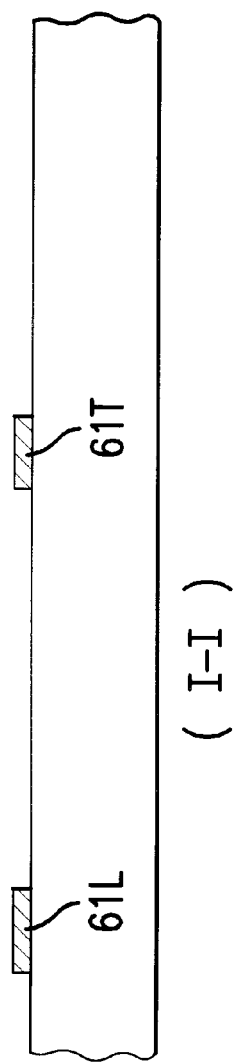
FIGS. 8A to 8D show cross-sectional views of fabricating the LCD shown in FIG. 7.

Referring to FIG. 8A, a conductive layer is formed on a glass substrate 800 to the thickness of about 3000 Å to 4000 Å. The source line 61L and the first storage electrode line 61T are formed by etching the conductive layer through photolithography.

The data line 61L and the first storage electrode line 61T are formed in parallel as is shown in the layout. In this case, the conductive layer is formed by depositing one of Cr, Al, Mo and alloy thereof with a suitable method of deposition, such as sputtering. The etching of the conductive layer may be achieved by wet etching by using the solution of, such as phosphoric acid, nitric acid, acetic acid and water. Deposition and etching of the conductive layer are preferably carried out by above methods.

Figure 8B:
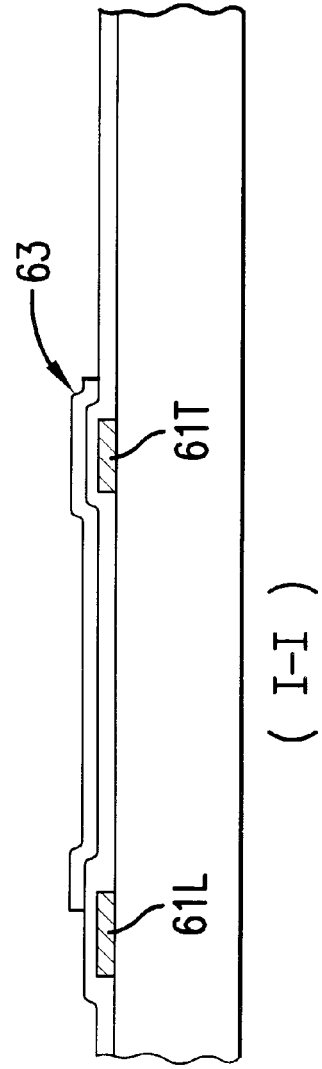

Referring to FIG. 8B, the buffer layer 62 is formed to the thickness of about 1000 Å to 3000 Å. The buffer layer 62 is formed by depositing an organic insulating material, such as, organic insulating material or inorganic insulating material including silicon oxide, silicon nitride or the like, preferably with a conventional method of PECVD (Plasma Enhanced Chemical Vapor Deposition).

A polycrystalline silicon layer is formed on the entire surface to the thickness of about 400 to 600 Å. The active layer 63 and interlayer 63A are formed by etching the silicon layer through photolithography. In this case, the active layer 63 is formed to be overlapped with the first storage electrode line 61T, and the interlayer 63A is formed at the crossing region of the data line 61L and the gate line 65L. The buffer layer 62 functions to prevent impurities of the glass substrate 600 from penetrating into the silicon layer or functions as a buffer layer to thermally isolate the silicon layer from the substrate during the crystallization of an amorphous silicon layer. Accordingly, the buffer layer 62 may be required to be formed to the thickness over about 1000 Å.

Figure 8C:
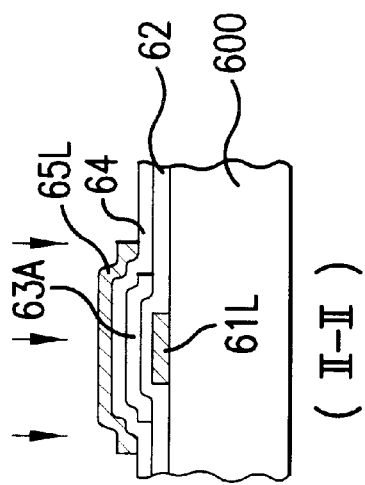
Figure 8C:
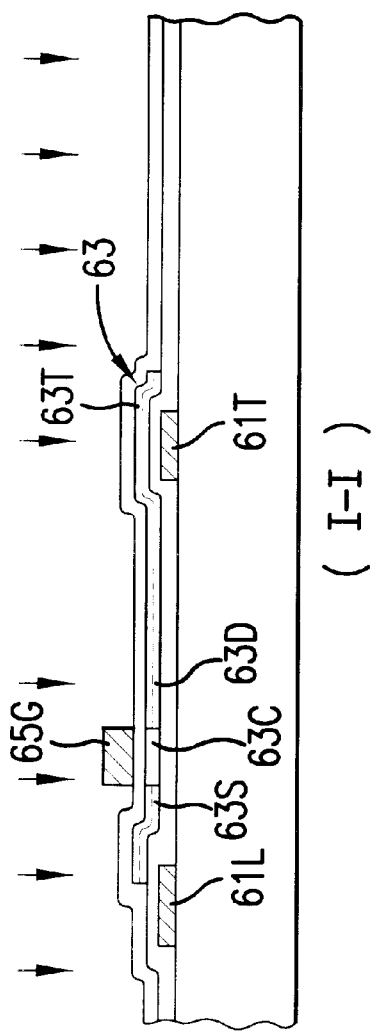

Referring to FIG. 8C, the gate insulating layer 64 is formed to the thickness of about 800 to 1000 Å. A conductive layer is formed on the insulating layer 64 to the thickness of about 3000 to 4000 Å. The gate electrode 65G and the gate line 65L are formed by etching the conductive layer. The source region 63S, the drain region 63D and the second storage electrode line 63T are formed in the active layer 63 by doping the disclosed surface with impurity. In this case, the gate electrode 65G on the insulating layer 64 works as an ion-blocking mask. The active layer 63 under the gate electrode 65G becomes the channel region 63C. In addition, the drain region 63D and the second storage electrode line 63T formed in a body. The ion-doping process usually adopts n-typed ions having high mobility carriers, but under certain conditions a p-typed TFT is to be formed by using p-typed ions as dopants.

The n-typed ion includes one of P, As and the like, while the p-typed ion has one of B and the like.

Figure 8D:
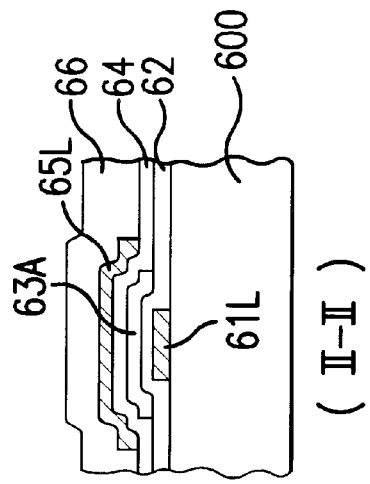
Figure 8D:
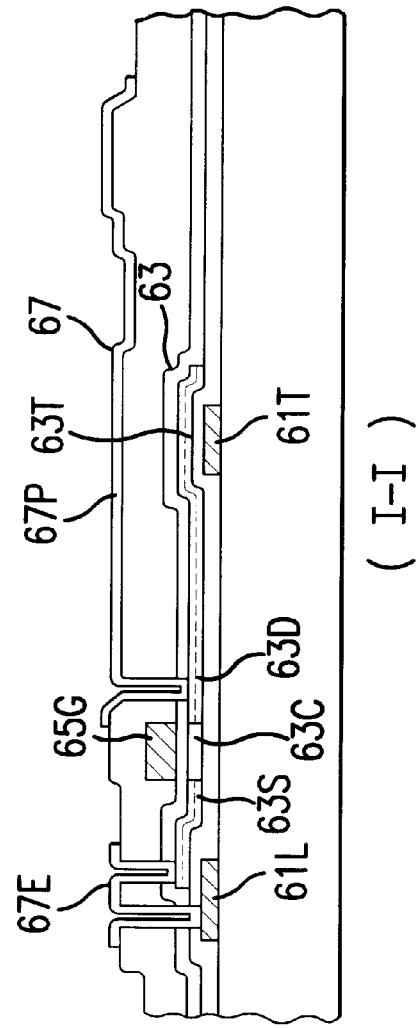

Referring to FIG. 8D, the passivation layer 66 is formed to the thickness of about 4000 to 5000 Å. Preferably, the passivation layer 66 may be formed with a sufficient thickness with a material having a low dielectric constant, such as an organic insulating material. The contact holes disclosing the source and the drain regions 63S and 63D and a portion of the data line 61L are formed by photo-etch patterning the passivation layer 66, the insulating layer 64 and the buffer layer 62.

The transparent conductive layer is formed on the whole surface to the thickness of about 500 to 1500 Å. The transparent wire 67E, which connects a disclosed portion of the data line 61L to the source region 63S, and the pixel electrode 67P, which is connected to the drain region 63D, are patterned by etching the transparent layer through photolithography. In this case, the transparent conductive layer is preferably formed by depositing a transparent conductive material, such as ITO(Indium Tin Oxide) or the like, using a conventional method of deposition, such as sputtering. The transparent conductive layer may be patterned by wet-etch using a strong acid solution, such as a solution of FeCl3, chloric acid and nitric acid.

The pixel electrode 67P may be partially overlapped with the data line 61L since the overlap of the pixel electrode 67P and the data line 61L provides small capacitance when the passivation layer 66 of organic insulating material is formed sufficiently thick. Accordingly, the aperture ratio of the pixel electrode increases since the formation of the wide pixel electrode is possible.

Figure 9:
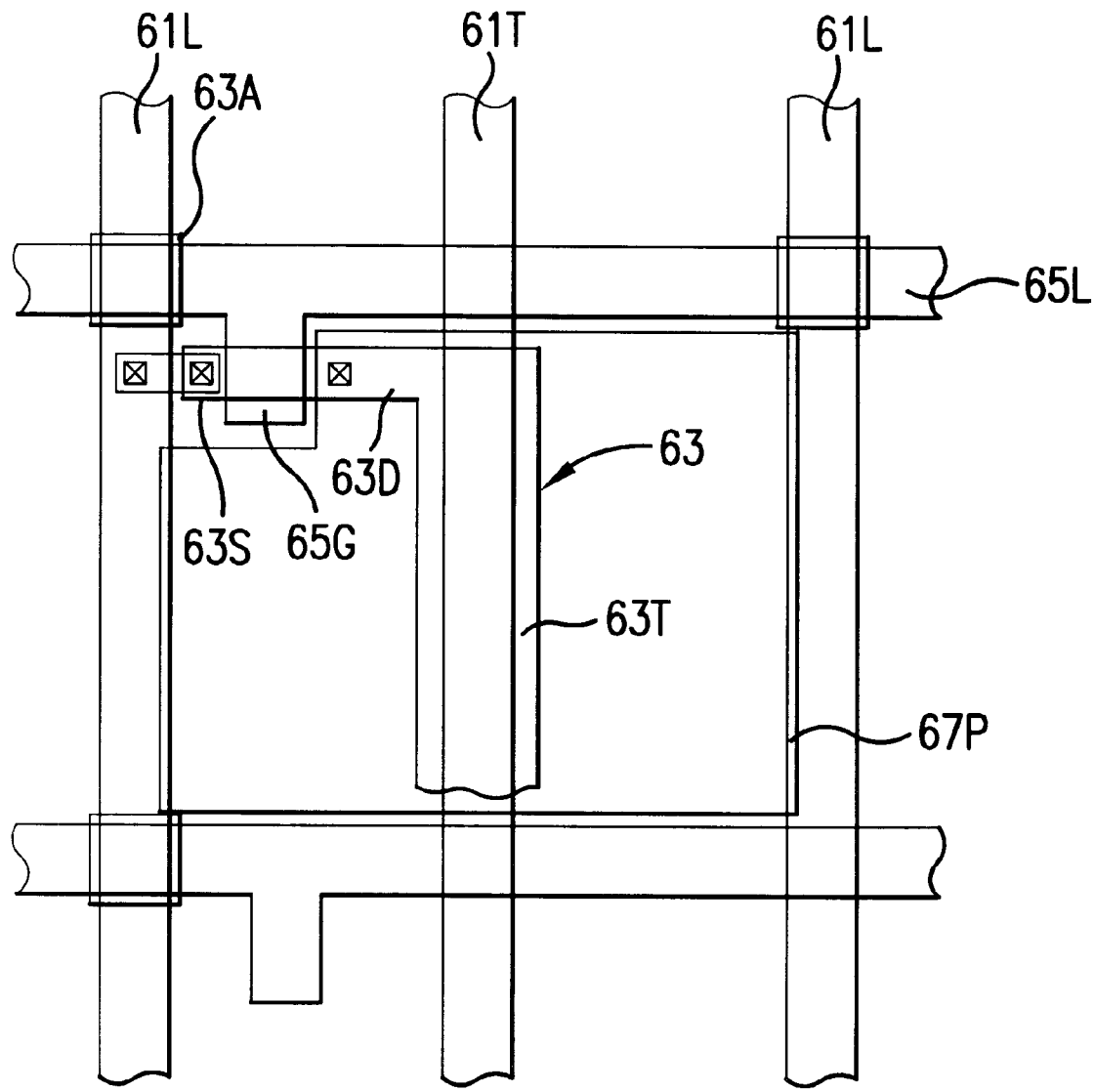
FIG. 9 shows a layout of the LCD according to the second preferred embodiment of the present invention.

The above preferred embodiment of the invention may be applied to a case in which the active layer 63 does not overlap with the data line 61L shown in FIG. 9 as well as to a case of overlapping the active layer 63 with the data line 61L as shown in FIG. 6.

FIG. 9 shows the same structure shown in FIG. 4 except that the active layer 63 is not overlapped with the data line 61L, and that the location of the transparent wire connecting the data line to the source region is changed due to the location of the active layer. Accordingly, the explanation about the FIG. 9 is not described hereof wherein the legends of showing the same parts are identical to each other.

The present invention may be applied to the devices having the structures of an insulating layer on a source/drain line and a co-planar TFT on the insulating layer.

The present invention uses polycrystalline silicon having excellent reliability and provides a simplified manufacturing process by reducing the deposition steps involving an insulating layer in which source and drain wires having a BBC structure are formed on a substrate, and a buffer layer for the crystallization of silicon covers the source and drain wire. Compared to the method for a conventional coplanar structure, the fabricating process of the present invention is also simplified by forming a contact hole with a single photo-etch. Moreover, the present invention is also applied to a device requiring a wire of low resistance since the buffer layer of buffer is deposited thick enough to form sufficiently thick source and drain electrodes.

Moreover, the present invention uses the active layer doped with impurity as a second storage electrode line. As a result, the present invention reduces the doping steps in comparison to the case where a first storage electrode line is formed on the active layer.

It is possible for the present invention to overlap the pixel electrode with the data line by means of inserting an organic insulating layer of a low dielectric constant between the data line and the pixel electrode. Accordingly, the aperture ratio of the pixel increases.

Finally, the electrical short between the data line and the gate line is prevented by forming a structure of a data line/buffer layer/interlayer/insulating layer/gate line in order.

It will be apparent to those skilled in the art that various modifications and variations can be made in a TFT, LCD and fabricating methods thereof of the present invention without departing from the spirit or scope of this inventions. Thus, it is intended that the present invention cover the modifications and variations of this invention provided they come within the scope of the appended claims and their equivalents.

What is claimed is:

1. A thin film transistor, comprising:
   a substrate;
   source and drain electrodes on said substrate;
   a first buffer layer covering said source and drain electrodes and a disclosed surface of said substrate;
   an active layer on said first buffer layer, said active layer having a source region, a channel region and a drain region;
   a sate insulating layer on said active layer;
   a gate electrode on said gate insulating layer;
   a second buffer layer covering the active layer and the gate electrode;
   a first conductive layer connecting said source electrode to said source region, said first conductive layer being a transparent conductive layer; and
   a second conductive layer connecting said drain electrode to said drain region through thee second contact hole, said second conductive layer being a transparent conductive layer.

2. The thin film transistor according to claim 1, wherein said first and said second conductive layers are Indium Tin Oxide layers.

3. The thin film transistor according to claim 1, wherein said source and drain electrodes are formed with a double layer that includes an Al layer and a Mo layer.

4. The thin film transistor according to claim 1, wherein said gate insulating layer and said gate electrode are substantially overlapped with each other and substantially aligned over said channel region.

5. The thin film transistor according to claim 1, wherein a certain region is formed between said source region and said channel region, said gate insulating layer substantially overlaps with said channel region and said source region, and said gate electrode is substantially overlapped with said channel region.

6. The thin film transistor according to claim 5, wherein said certain region is an LDD region.

7. The thin film transistor according to claim 5, wherein said certain region is an off-set region.

8. A thin film transistor circuit comprising:
   a first thin film transistor having a substrate, a first source electrode and a first drain electrode on said substrate, a buffer layer covering said source electrode and said drain electrode and a disclosed surface of the substrate, a first active layer formed on said buffer layer, wherein said first active layer has a first source region, a first channel region and a first drain region, a first gate insulating layer on said first active layer, and a first gate electrode on said first gate insulating layer;
   a second thin film transistor having the substrate, a source electrode and a drain electrode on said substrate, the buffer layer covering said source electrode and said drain electrode and the disclosed surface of the substrate, a second active layer formed on said buffer layer, wherein said second active layer has a second source region, a second channel region and a second drain region, a second gate insulating layer on said second active layer, and a second gate electrode on said second gate insulating layer;
   a first transparent conducting wire connecting said first source electrode and said first source region of said first thin film transistor;
   a second transparent conducting wire connecting said second source electrode and said second source region of said second thin film transistor; and
   a third connecting wire connecting said first drain electrode and said first drain region of said first thin film transistor to said second drain electrode and said second drain region of said second thin film transistor.

9. A liquid crystal display comprising:
   a substrate;
   a data line on said substrate;
   a buffer layer covering said data line;
   an active layer on said buffer layer, said active layer having source, channel and drain regions;
   a insulating layer covering said active layer;
   a gate electrode substantially overlapping said channel region;
   a gate line connected to said gate electrode, said gate line crossing with said data line;
   a passivation layer covering said gate electrode and said gate line;
   a first contact hole in said first, said second and said passivation layer, said first contact hole disclosing a portion of said data line;
   a second contact hole disclosing said source region;
   a third contact hole disclosing said drain region;
   a transparent conductive wire connecting said data line to said source region through said first and second contact holes; and
   a pixel electrode connected to said drain region through said third contact hole.

10. The liquid crystal display according to claim 9, further comprising:
    a first storage electrode line on said insulated substrate, said first storage electrode formed with a material identical to said data line;
    an insulating layer covering said first storage electrode line; and
    a second storage electrode line formed with said drain region of said active layer, said second storage electrode line with said first storage electrode line forming a storage capacitor.

11. The liquid crystal display according to claim 9, said liquid crystal display further comprising a interlayer at a crossing part between said data line and said gate line, said interlayer formed with a material identical to that of said active layer.

12. The liquid crystal display according to claim 9, wherein said passivation layer is formed with an organic insulating layer.

13. The liquid crystal display according to claim 9 or claim 12, wherein said pixel electrode is overlapped with said data line.

14. The liquid crystal display according to claim 9, wherein said source region in said active layer is overlapped with said data line.

15. The liquid crystal display according to claim 9, wherein said source region in said active layer is not overlapped with said data line.

16. A thin film transistor, comprising:

a substrate;

source and drain electrodes on said substrate;

a first buffer layer covering said source and drain electrodes and a disclosed surface of said substrate;

an active layer on said first buffer layer, said active layer having a source region, a channel region and a drain region;

a gate insulating layer on said active layer;

a gate electrode on said gate insulating layer;

a second buffer layer covering the active layer and the gate electrode;

a first contact hole formed in said first buffer layer and said second buffer layer, said first contact hole disclosing said source electrode and source region;

a second contact hole formed in said first buffer layer and said second buffer layer, said second contact hole disclosing said drain electrode and said drain region;

a first conductive layer connecting said source electrode to said source region through the first contact hole, said first conductive layer being a transparent conductive layer; and a second conductive layer connecting said drain electrode to said drain region through the second contact hole, said second conductive layer being a transparent conductive layer.

17. The thin film transistor according to claim 16, wherein said first and said second conductive layers are Indium Tin Oxide layers.

18. The thin film transistor according to claim 16, wherein said source and drain electrodes are formed with a double layer that includes an Al layer and a Mo layer.

19. The thin film transistor according to claim 16, wherein said gate insulating layer and said gate electrode are substantially overlapped with each other and substantially aligned over said channel region.

20. The thin film transistor according to claim 16, wherein a certain region is formed between said source region and said channel region, said gate insulating layer substantially overlaps with said channel region and said source region, and said gate electrode is substantially overlapped with said channel region.

21. The thin film transistor according to claim 20, wherein said certain region is an LDD region.

22. The thin film transistor according to claim 20, wherein said certain region is an off-set region.

* * * * *